*INVENTORS.*
GUNNAR A.F. WINCKLER
RICHARD C. EVANS
BY Walter D. Hunter

INVENTORS.
GUNNAR A.F. WINCKLER
RICHARD C. EVANS
BY
Walter D. Hunter

United States Patent Office
3,303,057
Patented Feb. 7, 1967

1 2

3,303,057
THERMOELECTRIC GENERATOR

Gunnar A. F. Winckler, Orange, and Richard C. Evans, Hamden, Conn., assignors, by mesne assignments, to United Nuclear Corporation, New Haven, Conn., a corporation of Delaware Filed May 2, 1960, Ser. No. 26,317
12 Claims. (Cl. 136—205)

This invention relates to thermoelectric devices embodying novel structural features and to a method for the production of such thermoelectric devices. This invention also relates to that class of thermoelectric devices known as thermoelectric generators.

A further characteristic of the class of thermoelectric devives to which this invention relates is that at least one element is formed of a semi-conductor material, such as, bismuth telluride, lead telluride, lead selenide, and the like.

A typical example of a thermoelectric device is the wellknown thermocouple. As shown in the art the thermocouple converts heat energy directly into electrical energy. Thus the use of steam turbines together with related equipment is dispensed with. As commonly constructed the thermoelectric generator consists of a number of thermocouple units or thermoelectric devices suitably connected. A single thermocouple is in itself a thermoelectric generator, however, the power output of thermocouples known to the art is so small that in practical application a number of thermocouple units or thermoelectric devices are joined together to form a thermoelectric generator. As is well known if one of the two junctions of a thermocouple made by joining together dissimilar metals at two places so as to form a closed circuit is heated, a current will flow.

Thermoelectric generators have not enjoyed wide acceptance as devices for the generation of electrical power for several reasons. With the thermoelectric devices known to art the bulkiness and weight of units capable of generating a useful power output has greatly limited the use of such devices. In addition, units produced to date have been found to be neither sturdy, durable or reliable in operation. In most instances the thermoelectric generator is subjected to considerable heat cycling, that is, the unit is heated up to operating temperature which at the hot junctions may be as high as 600° C. and then after being operated for few hours may be allowed to cool down again to room temperature. Such radical temperature changes cause severe expansion and contraction problems to be encountered and failure to overcome these problems has been one of the major causes contributing to the unreliability of existing thermoelectric generators. Frequently during the heating and cooling cycles the junctions between the connecting elements of existing thermoelectric devices and the thermoelectric elements are ruptured thus rendering the devices inoperative.

Another problem in constructing thermoelectric generators in which a number of thermoelectric devices are joined together has been that of the internal power loss due to the high resistance of the assembled units. It is especially important in the thermoelectric devices that a high degree of electrical conductivity be maintained at the junctions of the thermoelectric elements with the connecting elements.

Although the thermoelectric devices described in this specification and appended claims may be referred to as having the thermoelectric elements thereof fabricated from bismuth telluride, lead telluride, or other wellknown thermoelectric materials it is to be understood that such description is to not to be made by way of limitation, but is utilized merely for the purpose of aiding in the explanation of the novel structure embracing the present invention.

The semi-conductor material employed in the thermoelectric elements of the thermoelectric devices of this invention can be for example, antimony, which in the semicondutcor art is referred to as a P-type or positive type material; i.e., a material having an excess of electron vacancies in its atomic structure, or it can be, for example, bismuth, known in the art as an N-type or negative type material; i.e., a material having an excess of electrons in its atomic structure. In addition the semi-conductor materials employed can also contain traces of other materials admixed.

An object of the present invention is to provide a highly efficient thermoelectric device capable of converting energy in the form of heat into electric energy with substantially greater efficiency than has previously been possible.

A further object of this invention is to provide an improved thermoelectric device suitable for use in thermoelectric generators and the like in which the rigid thermoelectric elements disposed between connector elements form with the connector elements a rigid, interlocked structure.

Another object of this invention is to provide an improved thermoelectric device in which a broad or expanded contact of substantial length is present between the thermoelectric elements and the connecting elements thus increasing the electrical output.

A further object of this invention is to provide a method of forming a rigid, interlocked, thermoelectric device suitable for use in thermoelectric generators and the like in which the rigid thermoelectric elements disposed between the conecting elements are formed by pressing finely-divided thermoelectric material.

A further object of this invention is to provide a method of connecting thermoelectric devices in series without the use of wires or other connectors by the act of pressing finely-divided thermoelectric material to form the rigid, thermoelectric elements.

Another object of this invention is to provide a rigid, interlocked, thermoelectric generator having a plurality of thermoelectric devices in which all of the hot ends are disposed towards the heat source and in which all of the cold ends are disposed away from the heat source where they can readily be cooled by radition to the air or by other cooling means.

Another object of this invention is to provide an improved thermoelectric generator in the form of a rigid disc having a centrally located aperture adapted to receive a heat source which comprises a plurality of thermoelectric devices of the aforementioned type held in rigid, interlocked relationship and having all of the hot ends of the said thermoelectric devices disposed towards the central opening of the disc and having all of the cold ends disposed away from the heat source and at a point where they can readily be cooled.

Other objects and advantages of this invention will become apparent from the embodiments of my invention particularly described in relation to the drawings forming part hereof, in which.

Figure 1:
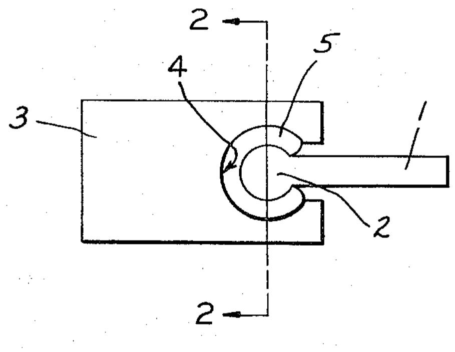
FIGURE 1 is a plan view of a thermoelectric device of this invention having one thermoelectric element.
Figure 2:
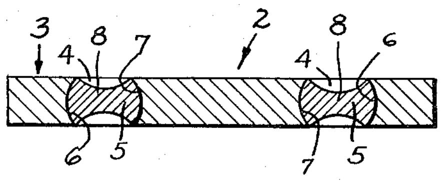
FIGURE 2 is a cross-sectional view taken on line 2—2 of FIGURE 1.

FIGURE 1 shows a rigid, interlocked, thermoelectric device in which a single thermoelectric element which can be of the positive or negative type is held in close contact between a heat conductor element and a connecting element. Heat conductor element 1 which can be made of, for example, sheet brass stock, has an expanded end forming lug 2. Receptacle 4 in connecting element 3, which is adapted to receive lug 2, is oversized relative to lug 2 and has a contour matching that of lug 2. Connecting element 3 can also be made, for example, from sheet brass stock. Any metals or alloys may be utilized for heat conductor 1 and connecting element 3 so long as they are good conductors of heat and electricity and so long as they are dissimilar electrically from the thermoelectric material of thermoelectric element 5 which is received in receptacle 4. The major transverse dimension of lug 2 is greater than the transverse dimension of the opening leading into receptacle 4 in connecting element 3. Lug 2 is positioned within receptacle 4 in centered relationship and without making electrical contact with connecting element 3. Rigid thermoelectric element 5, which can be, for example, bismuth telluride, is disposed between the wall of receptacle 4 and lug 2 and is in close contact and acts against undercut matching surface 6 (as shown in FIGURE 2) of receptacle 4 in connecting element 3 and undercut matching surface 7 (as shown in FIGURE 2) of lug 2. Heat conductor 1 and connecting element 3 with rigid thermoelectric element 5 in place form a rigid, interlocked, thermoelectric device of high efficiency. The undercut surface 6 is a groove in that face of the connecting element 3 which defines receptacle 4, and undercut surface 7 is a groove in that face of lug 2 opposing the grooved face of connecting element 3.

FIGURE 2 shows the heat barrier incorporated in rigid thermoelectric element 5. Neck portion 8 of rigid thermoelectric element 5 connects the two end portions of rigid thermoelectric element 5 thus forming a heat barrier. Such a barrier acts to effectively reduce the transfer of heat between the junctions formed at the point of contact between the brass connecting elements and the thermoelectric material and thus greatly improves the efficiency of the thermoelectric device. It is well known in the art that the current generated by a given thermoelectric device depends upon the temperature difference maintained between the hot and cold junction.

FIGURE 2 also shows the contacting faces of thermoelectric element 5 and lug 2 and of thermoelectric element 5 and receptacle 4 which are formed as mating surfaces.

An important feature of the thermoelectric device of FIGURE 1 is that an expanded band-type contact of substantial length is present between lug 2 of heat conductor element 1 and thermoelectric element 5 and between connector element 3 and thermoelectric element 5, thus reducing the resistivity of the device at the junctions which in turn, increases the overall efficiency. It has been found that the power output of a thermoelectric device of the type shown in FIGURE 1 is substantially greater than the output of a conventional thermoelectric device constructed of the same materials and operating under the same conditions.

The rigid interlocked thermoelectric device shown in FIGURE 1 is formed by assembling lug 2 of heat conductor element 1 within the receptacle of connector 3 in the manner previously described, arranging the assembly in a suitable press (not shown), placing in the space between lug 2 and receptacle 4 a quantity of finely-divided thermoelectric material, and forming the rigid thermoelectric element by pressing the finely-divided thermoelectric material. For example, bismuth telluride (95 percent through 100 mesh), can be pressed at a pressure of about 15 tons/sq. in. to form a satisfactory, rigid, thermoelectric element. The undercut surface 6 of receptacle 4 in connecting element 3 and undercut surface 7 of lug 2 can be tinned with soft solder if desired to promote a better bond between the thermoelectric elements and the matching surfaces of receptacle 4 and lug 2.

Figure 3:
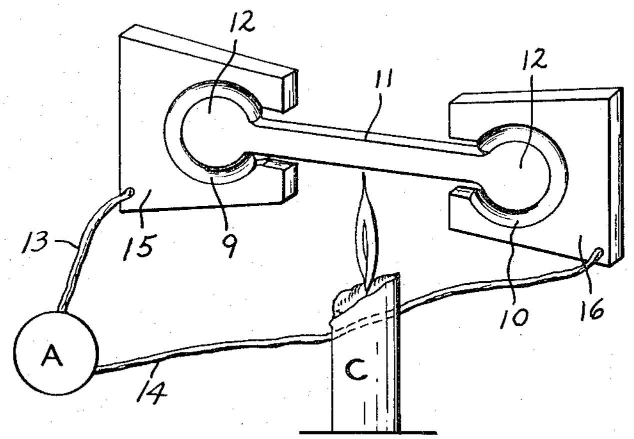
FIGURE 3 is a perspective view of a thermoelectric device of this invention having a positive and a negative thermoelectric element.

FIGURE 3 shows another embodiment of this invention. The rigid, interlocked, thermoelectric device of FIGURE 3 is in effect two thermoelectric devices of the type shown in FIGURE 1 in which the two heat conductor elements are joined together to form a single rigid heat conductor element. The only restriction with regard to the device of the type shown in FIGURE 3 is that one thermoelectric element must be of the positive type, for example, p-lead telluride, and the other must be of the negative type, for example, n-lead telluride. Heat conductor 11 which can be made of, for example, sheet brass stock has expanded ends forming heat distributing lugs 12. Connecting elements 15 and 16 can be made of, for example, sheet brass stock. Each of the connecting elements 15 and 16 has a receptacle which is adapted to receive one of the lugs 12, which is oversized relative to lugs 12 and which has a contour matching that of lugs 12. The major transverse dimension of the lugs 12 is greater than the transverse dimension of the opening leading into the receptacles. One lug 12 is positioned within the receptacle of connecting element 15 in centered relationship and without making electrical contact with connecting element 15. Rigid positive thermoelectric element 9, is disposed between the wall of the receptacle of connecting element 15 and lug 12 positioned therein and is in close contact and acts against undercut matching surfaces of the receptacle and the lug 12. Rigid negative thermoelectric element 10, is disposed between the wall of the receptacle in connecting element 16 and the lug 12 positioned therein and is in close contact and acts against undercut matching surfaces of the receptacle and the lug 12. Rigid thermoelectric elements 9 and 10 are formed in two main portions connected by a neck portion to establish a heat barrier. Heat conductor 11 and connecting elements 15 and 16 with rigid thermoelectric elements 9 and 10 in place form a highly efficient rigid, interlocked, thermoelectric device.

FIGURE 3 also shows an electrical circuit completed through a load, here an ammeter A, by means of leads 13 and 14 connected to connector elements 15 and 16 respectively. When a heat source, such as candle C, is utilized to heat the heat conductor element 11, which in turn directs heat along element 11 to lugs 12 and then directly to thermoelectric elements 9 and 10, a substantial electrical current is produced by this highly efficient, thermoelectric device.

Figure 4:
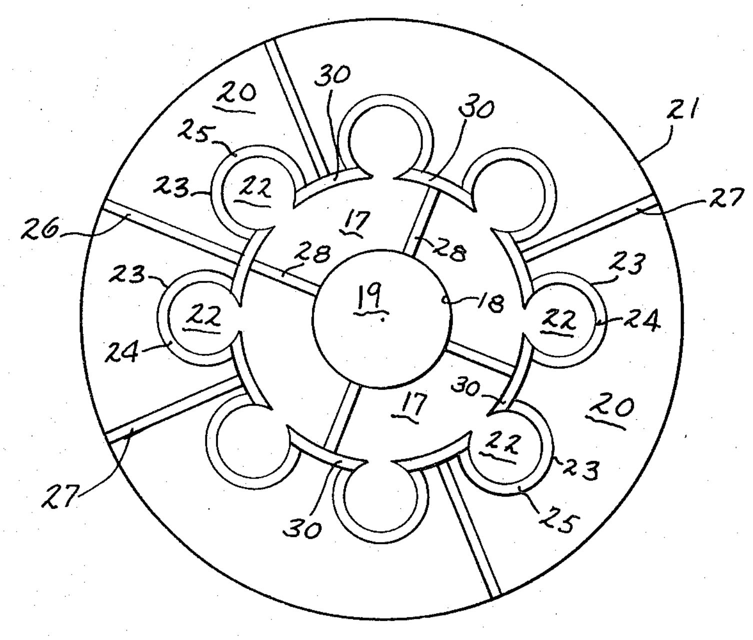
FIGURE 4 is a plan view of a disc-type, series-connected, thermoelectric generator having a plurality of pairs of alternately disposed positive and negative thermoelements.

FIGURE 4 is a plan view of a rigid, interlocked, double-ring disc-type thermoelectric generator having a plurality of pairs of thermoelectric elements connected in series about the double-ring. Each pair of thermoelectric elements comprises a positive thermoelectric element and a negative thermoelectric element. In effect each pair of thermoelectric elements together with the corresponding connecting elements constitutes a device of the type shown in FIGURE 3.

A plurality of electricaly insulated segments 17, which can be fabricated, for example, from metal sheet stock, form inner annular ring 18 and define center aperture 19 which is adapted for receiving a heat source. A corresponding plurality of electrically insulated segments 20, which can also be fabricated, for example, from metal sheet stock, form outer annular ring 21 which is positioned in radially-spaced relationship to inner annular ring 18. Each segment 17 is provided along its outer periphery wall with two lugs 22 which are in spaced relationship and which, in the device shown in FIGURE 4, are segments of circles having a major transverse dimension greater than the chord length at the point of attachment to annular segment 17. Lugs 22 are positioned in spaced-apart relationship and extend outward radially.

Each segment 20 of outer annular ring 21 is provided with two receptacles 23, oversized relative to lugs 22, and positioned in spaced relationship. Receptacles 23 have a contour matching that of lugs 22 and are adapted to receive lugs 22. One lug 22 is positioned in each receptacle 23 in centered relationship and without making electrical contact with it. Rigid positive thermoelectric elements 24 and negative thermoelectric elements 25 which are disposed between the walls of receptacles 23 and lugs 22 in alternate arrangement are in close contact with and act against undercut surfaces of receptacles 23 and lugs 22. Rigid thermoelectric elements 24 and 25 are formed in two main portions connected by a neck portion thus establishing a heat barrier. The segments of inner annular ring 18 are displaced angularly from those of outer annular ring 21 so that one lug 22 of each segment 17 is positioned in contact with a positive thermoelectric element 24, and the remaining lug 22 of the same segment is positioned in contact with the next-in-line negative thermoelectric element 25. This angular displacement of the segments of the said inner and outer rings results in the connection of the positive and negative thermoelectric elements in series.

Rigid thermoelectric elements 24 and 25 in place between the walls of receptacles 23 of segments 20 and lugs 22 of segments 17 form with segments 20 and segments 17 a rigid, interlocked, double-ring, disc-type thermoelectric device. The positive thermoelectric element 24 and negative thermoelectric element 25 of one segment 20 are electrically insulated from each other by insulation strip 26 thus interrupting the series connection of the segments and providing connection points for electrical power take-off from the thermoelectric generator.

Insulation strip 26 and insulation elements 27 and 28 can be made of any suitable insulating material such as asbestos, mica, mineral wool, etc., or they can be air spaces. An insulating cement composed of powdered asbestos and powdered magnesia mixed in a solution of water glass which can be applied by brushing or spraying can also be employed. After applying, such a cement must be allowed to dry. A cement formed of fused and powdered magnesia mixed with a bond of clay may also be utilized. The latter cement requires drying followed by the addition of heat to set properly.

In order to further increase the rigidly of the double-ring, disc-type, thermoelectric generators of this invention, electrically insulated, interlocking, connecting members can be utilized to join the spaced segments of the outer ring.

An important feature of the embodiment of the invention shown in FIGURE 4 is that, when a heat source is positioned within aperture 19, all of the hot ends of the thermoelectric generator are developed in segments 17 of inner annular ring 18 which are disposed towards the heat source, by contrast all of the cold ends of the generator are developed in segments 20 of outer annular ring 21 which are disposed away from the heat source where they can readily be cooled by radiation to the air or by other means.

The rigid, interlocked, disc-type thermoelectric generator of FIGURE 4 is formed by assemblying the inner annular ring 18 within the outer annular ring 21 so that lugs 22 of segments 17 of the inner annular ring are positioned within the receptacles 23 of segments 20 of the outer annular ring, placing the assembly in a suitable press, and forming the rigid thermoelectric elements by pressing finely-divided, thermoelectric material.

As is evident drom FIGURE 4 the only electrical and thermal connection between the inner and outer ring is through the thermoelectric elements 24 and 25. As is also evident from the figures to flow of heat from the inner ring of segments is minimized by the series of voids 30 which separate the two ring structures. Further it is evident that not only is the flow of heat to the lugs 22 facilitated by the direct thermal connection between the segments 17 and the lugs but that flow of heat from the lugs to the outer segments is retarded by the constriction or neck formed in the thermoelectric elements 24 and 25 as best seen in FIGURE 2. In contrast to the restriction in heat flow the undercutting of the lug and connector edge surfaces provides an amplified conductive surface for flow of electric curent through the thermoelectric element.

In addition to the heat retarding and current flow inducing properties of the described structure there are additional distinct mechanical advantages which add to the effectiveness of the novel thermoelectric structure. These advantages result primarily from forming lugs and lug receptacles in electrical connectors which can be interlocked in series connection in a closed circular array by the use of the thermoelectric element as an effective structural interlocking agent. In particular, with reference to FIGURE 4, it is evident that each lug and receptacle are interlocked by the thermoelectric element. The interlocking of the two lugs of one inner connector with receptacles of two outer connectors provides an effective interlocking, in addition to a series connection of inner and outer segments or connectors. Further the formation of connectors as segments of two circles results in the strengthening of the overall interlocking into two closed, self-supporting, interlocked rings. This dual ring structure readily accommodates thermal expansion with minimal radial or angular stress.

The undercutting and press filling of the lug and receptacle surfaces provides the additional stability of an effective vertical or axial mechanical locking of the several segments to prevent a vertical warpage of the plate or disk contour of the double-ring structure.

While the specific generator of FIGURE 4 is shown as having four pairs of thermoelectric elements, it is to be understood that any number of pairs of thermoelectric elements may be employed as desired.

Figure 5:
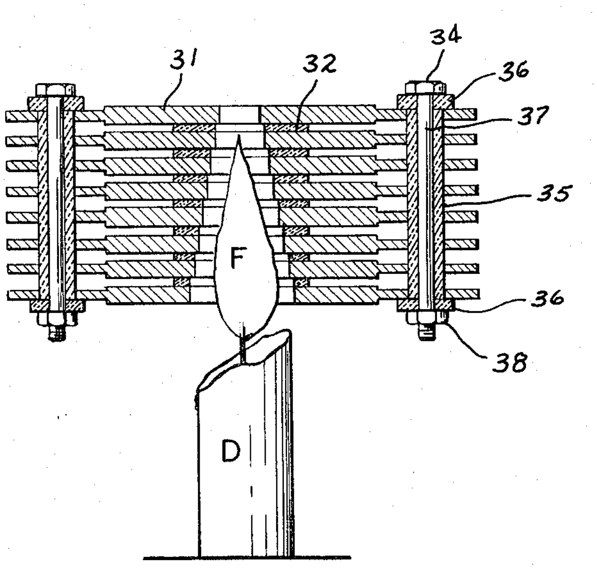
FIGURE 5 is a vertical cross-sectional view of a number of thermoelectric generator discs arranged together to form a stack or pile.

A number of the rigid, disc-type, thermoelectric generators of this invention can be assembled to form a stack or pile. The individual discs of such a stack or pile can be electrically connected in series or parallel by wires or by other suitable connectors to provide a greater amperage or voltage as desired. FIGURE 5 shows such a stack formed with generator discs 31. Insulating washers 32 are positioned between the individual discs. The outer diameter of insulating washers 32 is selected so that the washers do not cover the outer annular rings of the disc and thus do not interfere with the cooling of the cold ends of the individual discs. The various elements of the stack are clamped together to form a rigid unit by bolt asemblies 34 which are insulated from the discs by insulating sleeves 35 and insulating washers 36. Each bolt asembly consists of a bolt 37 and a lock nut 38. Insulating washers 32 and 36 and insulating sleeves 34 can be made, for, example, from asbestos or silicone glass fiber plastic.

The modification of this invention shown in FIGURE 5 is adapted to be heated by a flame F such as that produced by a candle D or by a hydrocarbon burner. The diameter of the central aperture of the individual discs is incremently decreased from the bottom disc to the top disc of the stack so as to provide a central opening having a contour closely matching that of flame F positioned within the opening in the stack.

The thermoelectric devices described herein are inexpensive to produce since sheet stock can be employed for the connecting elements and since relatively small amounts of thermoelectric materials are utilized in forming the thermoelectric elements. The usual expansion and contraction problems associated with devices known to the art have been eliminated in the novel thermoelectric devices of this invention in which the thermoelements and the connecting elements are held in rigid, interlocking, relationship. These devices can be subjected to considerable mechanical shock and still remain operable at a high efficiency.

While certain embodiments have been described herein, it will be understood that various changes and modifications can be made therein without departing from the scope of the invention.

What is claimed is:

1. A thermoelectric generator comprising, in combination, a heat conductor element having at each end an expanded lug, a pair of connecting elements each having a receptacle oversized with respect to said lugs and having a contour substantially matching said lugs, and a positive and a negative thermoelectric element, one thermoelectric element being disposed in each of said receptacles between each lug and connecting element, forming interlocking mechanical supports therewith and electrically connecting the elements.

2. A thermoelectric generator comprising, in combination, a heat conductor element having at each end an expanded lug, a pair of connecting elements each having a receptacle oversized with respect to said lugs and having a contour substantially matching said lugs, the opposed faces of said connecting elements and said lugs being undercut and aligned, and a positive and a negative thermoelectric element, one thermoelectric element being disposed in each of said receptacles between the opposed faces of each lug and connecting element, forming interlocking mechanical supports therewith and electrically connecting the elements.

3. A thermoelectric generator, according to claim 2, wherein each of said thermoelectric elements has a reduced neck portion intermediate its end portions.

4. A thermoelectric device comprising, in combination, a rigid thermoelectric element, a heat conductor element having an expanded end forming a heat distributing lug, a connecting element having a receptacle therein adapted to receive the said lug, said receptacle being oversized relative to said lug and having a contour matching that of the said lug, the opposed faces of said connecting element and said lug each having an undercut surface, said lug being positioned within the receptacle of the said connecting element without making electrical contact therewith and in centered relationship thereto, said rigid thermoelectric element being disposed in said receptacle between said receptacle and said lug and being in close contact with and acting against said undercut matching surfaces of said connecting element and said lug, said rigid thermoelectric element defining in cross-section at least two main portions connected by a neck portion and said rigid thermoelectric element forming with the said heat conductor element and the said connecting element a rigid, interlocked, thermoelectric device.

5. The thermoelectric device of claim 4 in which the undercut matching surfaces of the receptacle and the lug position therein are tinned.

6. A thermoelectric generator which comprises a pair of concentric, conductive, radially spaced rings forming a ring structure, each of said rings being in the form of spaced segments, each segment of the inner ring being electrically connected to two adjacent segments of the said outer ring to provide a series electrical connection about said ring structure, said electrical connection being through positive and negative thermoelectric elements to produce a flow of electric current about said ring structure when the inner ring is at a higher temperature than the outer ring, said thermoelectric elements further being formed so that in cross-section they define at least two main portions connected by a neck portion and disposed to form interlocking mechanical support connections between the spaced segments of said inner and outer rings integral with said electrical connections and means for removing electrical power from said ring structure.

7. The thermoelectric generator of claim 6 wherein the segments of the inner ring have outward extending lugs, the segments of the outer ring have receptacles therein adapted to receive the said lugs, the said lugs being positioned within the said receptacles and the said thermoelectric elements are disposed in said receptacles between said lugs and said outer ring.

8. The thermoelectric generator of claim 6 wherein the segments of the inner ring have outward extending lugs, the segments of the outer ring have receptacles therein adapted to receive the said lugs, the opposed faces of said lugs and said outer ring receptacles each having undercut surfaces and the said thermoelectric elements are disposed in said receptacles between said outer ring and the said lugs and in close contact with and acting against said undercut matching surfaces of the said receptacles and the said lugs.

9. The thermoelectric generator of claim 8 wherein the undercut matching surfaces of the outer ring receptacles and the lugs positioned therein are tinned.

10. A disc-shaped, thermoelectric generator comprising, in combination, $n$ pairs of rigid thermoelectric elements, each pair consisting of a positive and a negative thermoelectric element, an inner annular ring defining a center aperture adapted for receiving a heat source and having $n/2$ electrically insulated segments, an outer annular ring positioned in radially-spaced relationship to the said inner annular ring and having $n/2$ electrically insulated segments, each said segment of said inner annular ring having along the outer periphery wall thereof two expanded lugs in spaced relationship and extending outward radially, the major transverse dimension of said lugs being greater than the transverse dimension at the point of attachment to the segments of the inner annular ring, each said segment of the said outer annular ring having two receptacles adapted to receive said lugs and being oversized relative to said lugs, said receptacles being in spaced relationship and having a contour matching that of the said lugs, said lugs being positioned within said receptacles without making electrical contact therewith and in centered relationship thereto, said rigid positive and negative thermoelectric elements in alternate arrangement being disposed between the walls of the said receptacles and the said lugs positioned therein and being in close contact with and acting against undercut matching surfaces of the said receptacles and the said lugs, said rigid thermoelectric elements defining in cross-section at least two main portions connected by a neck portion, the segments of said inner annular ring being angularly displaced so that one lug of each said segment is positioned in contact with a positive thermoelectric element and the remaining lug thereof is positioned in contact with the next-in-line negative thermoelectric element thus connecting the thermoelectric elements in series, at least one segment of the said outer annular ring having the thermoelectric elements thereof electrically insulated from each other thus providing connection points for taking off the generated current, said rigid thermoelectric elements, disposed between the walls of the said receptacles of the segments of the outer annular ring and the said lugs of the segments of the inner annular ring forming with the said segments of the inner annular ring and the said segments of the outer annular ring a rigid, interlocked disc.

11. The disc-shaped thermoelectric generator of claim 10 in which the undercut matching surfaces of the receptacles and the lugs positioned therein are tinned.

12. The disc-shaped thermoelectric generator of claim 10 in which the lugs of the annular segments of the inner annular ring are segments of circles having a major transverse dimension greater than the chord length at the point of attachment of the said lugs to the segments of the inner annular ring.

(References on following page)

References Cited by the Examiner

UNITED STATES PATENTS

| | | | |
|---|---|---|---|
| 313,215 | 3/1885 | Lautensack | 136—208 |
| 2,502,399 | 3/1950 | Greeff | 136—211 |
| 2,952,725 | 9/1960 | Evans et al. | 136—228 |
| 2,972,653 | 2/1961 | Fritts et al. | 136—228 |

FOREIGN PATENTS

| | | |
|---|---|---|
| 339,137 | 11/1904 | France. |
| 371,523 | 3/1907 | France. |
| 264,855 | 4/1928 | Great Britain. |

OTHER REFERENCES

Horne: RCA-TN No. 305, November 1959.
Horne: RCA-TN 304, November 1959.
Horne et al.: RCA-TN 304, November 1959.

ALLEN B. CURTIS, *Primary Examiner.*

JOHN H. MACK, WINSTON A. DOUGLAS, *Examiners.*

J. BARNEY, A. M. BEKELMAN, *Assistant Examiners.*